(12) United States Patent
Dagan et al.

(10) Patent No.: US 11,062,902 B2
(45) Date of Patent: Jul. 13, 2021

(54) HETEROSTRUCTURE SYSTEM AND METHOD OF FABRICATING THE SAME

(71) Applicant: Ramot at Tel-Aviv University Ltd., Tel-Aviv (IL)

(72) Inventors: Yoram Dagan, Tel-Aviv (IL); Gil Markovich, Tel-Aviv (IL); Alon Ron, Tel-Aviv (IL); Amir Hevroni, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

(21) Appl. No.: 16/325,410

(22) PCT Filed: Aug. 16, 2017

(86) PCT No.: PCT/IL2017/050907
§ 371 (c)(1),
(2) Date: Feb. 14, 2019

(87) PCT Pub. No.: WO2018/033916
PCT Pub. Date: Feb. 22, 2018

(65) Prior Publication Data
US 2019/0273012 A1 Sep. 5, 2019

Related U.S. Application Data

(60) Provisional application No. 62/375,508, filed on Aug. 16, 2016.

(51) Int. Cl.
*H01L 21/02* (2006.01)
*H01L 31/18* (2006.01)

(52) U.S. Cl.
CPC .. *H01L 21/02293* (2013.01); *H01L 21/02483* (2013.01); *H01L 21/02499* (2013.01);
(Continued)

(58) Field of Classification Search
CPC ......... H01L 21/02107; H01L 21/02112; H01L 21/02172; H01L 21/02225; H01L 21/0226; H01L 21/02293; H01L 21/02365; H01L 21/02436; H01L 21/02483; H01L 21/02488; H01L 21/02499; H01L 21/02565; H01L 21/02598; H01L 21/0262;
(Continued)

(56) References Cited

U.S. PATENT DOCUMENTS

2015/0054037 A1 2/2015 Hao et al.
2017/0073839 A1* 3/2017 Mori ................. H01L 21/02516

FOREIGN PATENT DOCUMENTS

WO  WO 2018/033916  2/2018

OTHER PUBLICATIONS

Supplementary European Search Report and the European Search Opinion dated Dec. 16, 2019 From the European Patent Office Re. Application No. 17841215.1. (11 Pages).
(Continued)

*Primary Examiner* — Cheung Lee

(57) ABSTRACT

A method of fabricating a heterostructure system, comprises epitaxially growing a crystalline layer of a first substance on a crystalline base layer by surface catalysis in a solution, wherein the growth is self-terminated once a monolayer of the substance is formed on the base layer.

24 Claims, 6 Drawing Sheets
(5 of 6 Drawing Sheet(s) Filed in Color)

(52) U.S. Cl.
CPC .. *H01L 21/02565* (2013.01); *H01L 21/02628* (2013.01); *H01L 31/18* (2013.01)

(58) Field of Classification Search
CPC ......... H01L 21/02628; H01L 21/02631; H01L 21/76; H01L 21/762; H01L 21/7624; H01L 21/76248; H01L 29/04; H01L 29/045; H01L 29/12; H01L 31/18; H01L 33/02; H01L 33/16
See application file for complete search history.

(56) References Cited

OTHER PUBLICATIONS

Nicolau "Solution Deposition of Thin Solid Compound Films by A Successive Ionic-Layer Adsorption and Reaction Process", Applications of Surface Science, XP025955316, 22-23: 1061-1074, May 1, 1985.

Nicolau et al. "Solution Growth of ZnS, CdS and Zn1_xCDxS Thin Films by the Successive Ionic-Layer Adsorption and Reaction Process; Growth Mechanism", Journal of Crystal Growth, XP024473471, 92(1-2): 128-142, Oct. 1988.

Niesen et al. "Review: Deposition of Ceramic Thin Films at Low Temperatures From Aqueous Solutions", Solid State Ionics, XP004393768, 151(1-4): 61-68, Nov. 1, 2002.

Sankapal et al. "Successive Ionic Layer Adsorption and Reaction (SILAR) Method for the Deposition of Large Area (~10 cm2) Tin Disulfide (SnS2) Thin Films", Materials Research Bulletin, XP004229293, 35(12): 2027-2035, Sep. 2000.

Valkonen et al. "CdxZn1_xS Solid Solution Thin Films, CdS Thin Films and CdS / ZnS Multilayer Thin Films Grown by SILAR Technique", Applied Surface Science, XP000957306, 134(1-4): 283-291, Sep. 1998.

Valkonen et al. "Growth of ZnS, CdS and Multilayer ZnS / CdS Thin Films by SILAR Technique", Applied Surface Science, XP055648944, 115(4): 386-392, Aug. 1997.

Communication Pursuant to Article 94(3) dated Aug. 26, 2020 From the European Patent Office Re. Application No. 17841215.1. (5 Pages).

Ohtomo et al. "A High-Mobility Electron Gas at the LaAlO3/ SrTiO3 Heterointerface", Nature, XP002487284, 427(6973): 423-426, Jan. 29, 2004.

International Preliminary Report on Patentability dated Feb. 28, 2019 From the International Bureau of WIPO Re. Application No. PCT/IL2017/050907. (8 Pages).

International Search Report and the Written Opinion dated Nov. 20, 2017 From the International Searching Authority Re. Application No. PCT/IL2017/050907. (11 Pages).

Huijben et al. "Electronically Coupled Complementary Interfaces Between Perovskite Band Insulators", Nature Materials, 5: 556-560, Jun. 18, 2016. (5 Pages) p. 1,2,3,6.

Nakajima et al. "Epitaxial Growth Mechanism for Perovskite Oxide Thin Films under Pulsed Laser Irradiation in Chemical Solution Deposition Process", Chemistry of Materials, 20(23): 7344-7351, Nov. 20, 2008.

\* cited by examiner

Ba [samp_150c_1.IMS] - 137.90
Cts: 542898; Max: 21; Scale 1μm

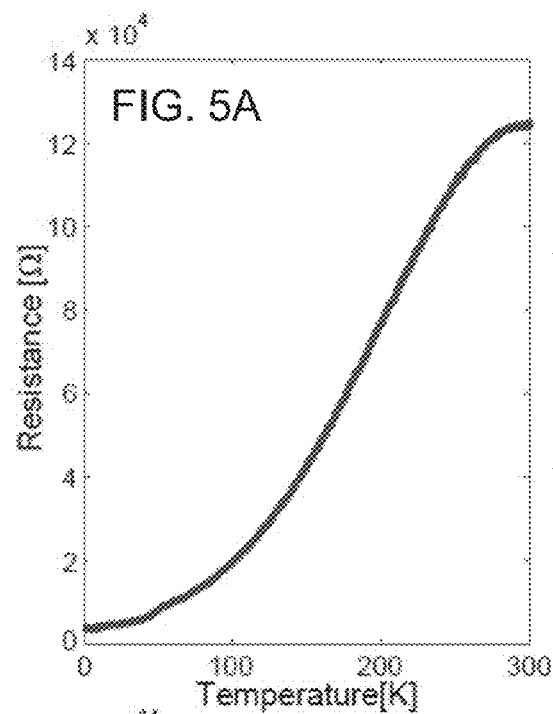
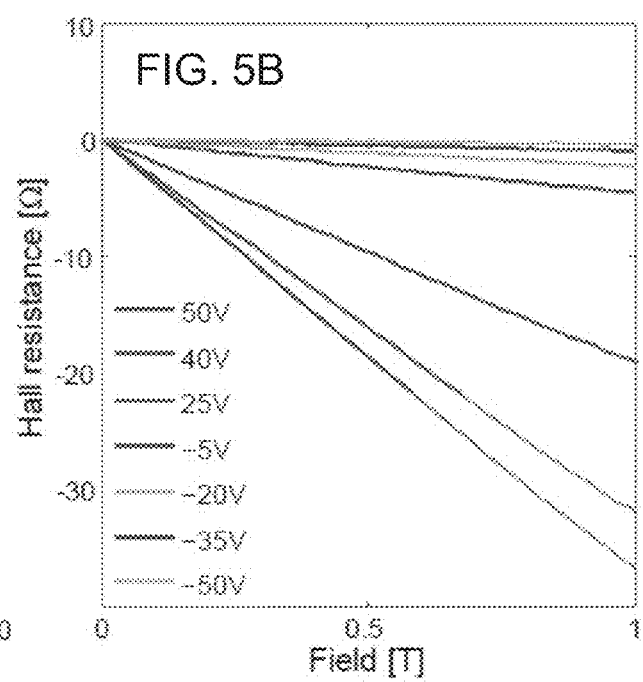
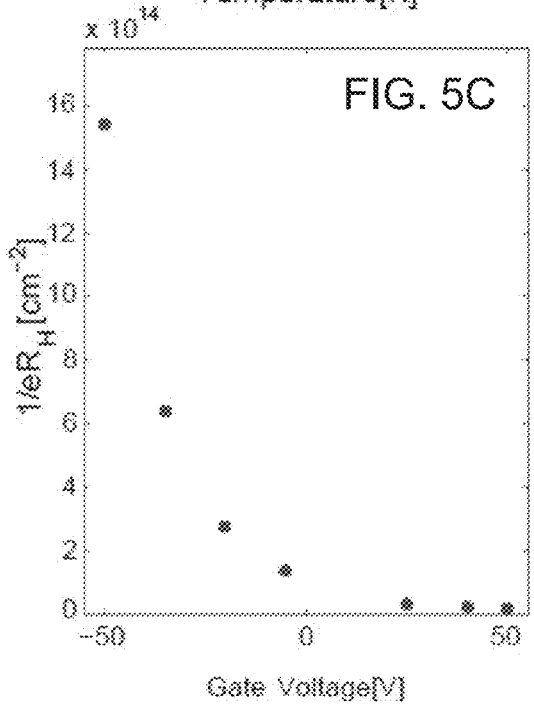
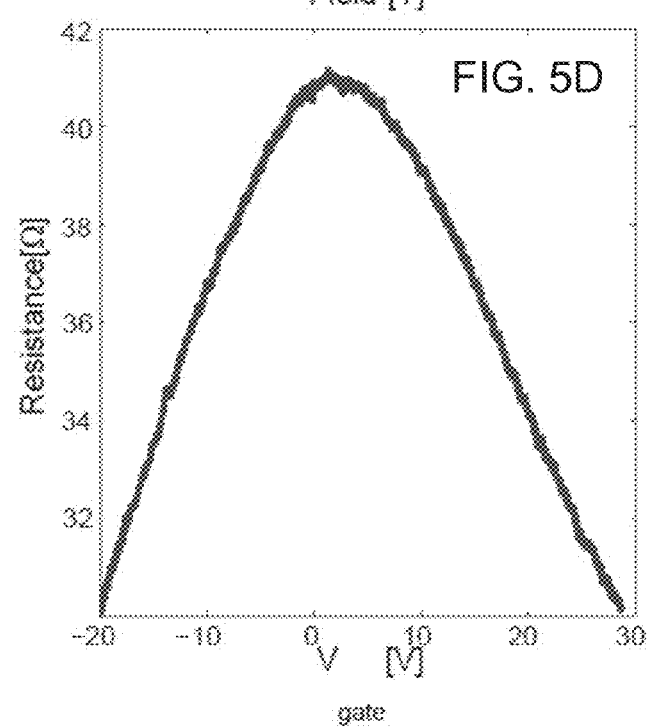

HETEROSTRUCTURE SYSTEM AND METHOD OF FABRICATING THE SAME

RELATED APPLICATIONS

This application is a National Phase of PCT Patent Application No. PCT/IL2017/050907 having International filing date of Aug. 16, 2017, which claims the benefit of priority under 35 USC § 119(e) of U.S. Provisional Patent Application No. 62/375,508 filed on Aug. 16, 2016. The contents of the above applications are all incorporated by reference as if fully set forth herein in their entirety.

RELATED APPLICATION

This application claims the benefit of priority of U.S. Provisional Patent Application No. 62/375,508 filed Aug. 16, 2016, the contents of which are incorporated herein by reference in their entirety.

FIELD AND BACKGROUND OF THE INVENTION

The present invention, in some embodiments thereof, relates to heterostructures and, more particularly, but not exclusively, to a heterostructure system having an oxide interface, to a method of fabricating such a heterostructure system, and to a system incorporating such a heterostructure system.

Oxide interfaces fabricated by thin film technologies, such as the Oxide interface between lanthanum aluminate ($LaAlO_3$) and strontium titanate ($SrTiO_3$), can combine degrees of freedom from their constituent materials with emergent phenomena not found in the constituent materials. These include superconductivity, magnetism, tunable spin-orbit interaction and quantum transport. For example, while both $LaAlO_3$ and $SrTiO_3$ are insulators, the oxide interface between these materials exhibits electrical conductivity. This emerged property has been explained as a result of stacking polar layers of $LaAlO_3$, accumulating potential energy.

Growth methods of epitaxial thin films can be categorized as physical and chemical. In physical methods, a beam of the film material is created and transported in vacuum onto a substrate. In chemical methods, a chemical precursor is used. The precursor is transferred in vacuum onto the substrate, and the surface of the substrate catalyzes the precursor dissociation reaction and the deposition of the film.

SUMMARY OF THE INVENTION

According to an aspect of some embodiments of the present invention there is provided a method of fabricating a heterostructure system. The method comprises: epitaxially growing a crystalline layer of a first substance on a crystalline base layer by surface catalysis in a solution, wherein the growth is self-terminated once a monolayer of the substance is formed on the base layer. The method optionally and preferably comprises epitaxially growing an additional crystalline layer of a second substance on the monolayer.

According to an aspect of some embodiments of the present invention there is provided a heterostructure system. The heterostructure system comprises a crystalline base layer, and a crystalline layer of a first substance, epitaxially grown on a surface of the base layer, and having a thickness of one atom or one formula unit of the substance over at least 70%, or at least 80%, or at least 90%, or at least 92%, or at least 94%, or at least 95%, or at least 96%, or at least 97%, or at least 98%, or at least 99% or at least 99.5% or at least 99.9% or at least 99.95% or at least 99.99% or at least 99.995% or at least 99.999% of an area over the base layer. The area typically encompasses the entire region of the surface of base layer that is occupied by the first substance. In some embodiments of the present invention the area encompasses the entire surface of the base layer.

According to some embodiments of the invention the heterostructure system comprises an additional layer of a second substance on the monolayer, thereby forming a heterostructure system comprising the base layer the monolayer and the additional layer.

According to some embodiments of the invention an interface between the layer of the first substance and the base layer constitutes mobile charge carrier.

According to some embodiments of the invention the interface constitutes mobile electrons.

According to some embodiments of the invention the interface constitutes mobile holes.

According to some embodiments of the invention the interface constitutes both mobile electrons and mobile holes.

According to some embodiments of the invention the crystalline base layer is made of an electrically insulating material.

According to some embodiments of the invention the crystalline layer of the first substance forms a half unit cell with a surface of the crystalline base layer on which the crystalline layer of the first substance layer is grown.

According to some embodiments of the invention the crystalline layer of the first substance forms a perovskite crystal structure with a surface of the crystalline base layer on which the crystalline layer of the first substance is grown.

According to some embodiments of the invention the perovskite structure is an oxide.

According to some embodiments of the invention the first substance comprises barium.

According to some embodiments of the invention the first substance comprises an element selected from the group consisting of strontium, calcium, magnesium, zinc, titanium, aluminum, zirconium, hafnium, tantalum, vanadium, niobium, manganese, chromium, iron, nickel, cobalt According to some embodiments of the invention the first substance is barium oxide.

According to some embodiments of the invention the first substance is vanadium oxide.

According to some embodiments of the invention the additional layer is made of an electrically insulating material.

According to some embodiments of the invention both the base layer and the additional layer are oxides.

According to some embodiments of the invention both the base layer and the additional layer have a perovskite crystal structure.

According to some embodiments of the invention the crystalline base layer comprises SrTiO3, and the additional layer is selected from the group consisting of $LaTiO_3$, $LaAlO_3$, $LaVO_3$, $KTaO_3$, $GdTiO_3$, $LaGaO_3$, $PrAlO_3$, $NdAlO_3$, $NdGaO_3$, $GdAlO_3$, $Al_2O_3$, $DyScO_3$, $CaZrO_3$, MgO, CaO, ZnO, $TiO_2$, $ZrO_2$, $HfO_2$ and $VO_2$.

According to some embodiments of the invention the crystalline base layer is $SrTiO_3$ terminated by $TiO_2$.

According to some embodiments of the invention the additional layer is at least 4 unit cells in thickness.

According to some embodiments of the invention the crystalline layer of the first substance is a polarity inversion layer.

According to some embodiments of the invention the crystalline base layer is a non-polar crystalline layer.

According to some embodiments of the invention the crystalline layer of the first substance is a polarity inversion layer, wherein the crystalline base layer is a non-polar crystalline layer, and wherein the additional crystalline layer is a polar crystalline layer.

Some embodiments of the present invention provide a heterostructure system having an interface between two layers that constitutes mobile charge carriers, e.g., mobile electrons, mobile holes or both mobile electrons and mobile holes. The interface is optionally and preferably created by means of polarity inversion layer between a non-polar crystalline layer and a polar crystalline layer.

Thus, according to an aspect of some embodiments of the present invention there is provided a heterostructure system. The heterostructure system comprises: a non-polar crystalline layer, a polarity inversion layer, epitaxially grown on the non-polar crystalline layer, and a polar crystalline layer, epitaxially grown on the polarity inversion layer. The interface between the non-polar crystalline layer and the polarity inversion layer constitutes mobile charge carriers.

According to some embodiments of the invention the interface constitutes mobile electrons.

According to some embodiments of the invention the interface constitutes mobile holes.

According to some embodiments of the invention the interface constitutes both mobile electrons and mobile holes.

According to an aspect of some embodiments of the present invention there is provided a method of fabricating a heterostructure system. The method comprises: epitaxially growing a polarity inversion layer on a non-polar crystalline layer to from an interface between the non-polar crystalline layer and the polarity inversion layer; and epitaxially growing a polar crystalline layer on the polarity inversion layer.

The polarity inversion layer is optionally and preferably grown by chemical deposition e.g., atomic layer deposition or chemical vapor deposition. In some embodiments of the present invention the polarity inversion layer is grown by solution atomic layer deposition.

The polar crystalline layer can be deposited by physical deposition (e.g., pulsed laser deposition, molecular beam epitaxy, metal organic molecular beam epitaxy, evaporation, sputtering, magnetron sputtering) or chemical deposition (e.g., atomic layer deposition or chemical vapor deposition). In some embodiments of the present invention the polar crystalline layer is grown by pulsed laser deposition.

According to some embodiments of the invention the non-polar crystalline layer is made of an electrically insulating material.

According to some embodiments of the invention the polar crystalline layer is made of an electrically insulating material.

According to some embodiments of the invention the thickness of the interface is from 1 to about 6 unit cells of the non-polar crystalline layer. According to some embodiments of the invention the thickness of the interface is a unit cells of the non-polar crystalline layer According to some embodiments of the invention the polarity inversion layer is a monolayer.

According to some embodiments of the invention the polarity inversion layer forms a half unit cell with a surface of the non-polar crystalline layer on which the polarity inversion layer is grown.

According to some embodiments of the invention the polarity inversion layer forms a perovskite crystal structure with a surface of the non-polar crystalline layer on which the polarity inversion layer is grown.

According to some embodiments of the invention the perovskite structure is an oxide.

According to some embodiments of the invention the polarity inversion layer comprises barium.

According to some embodiments of the invention the both the non-polar and the polar crystalline layers are oxides.

According to some embodiments of the invention both the non-polar and the polar crystalline layers have a perovskite crystal structure.

According to some embodiments of the invention the non-polar crystalline layer comprises $SrTiO_3$, and the polar crystalline layer is selected from the group consisting of $LaTiO_3$, $LaAlO_3$, $LaVO_3$, $KTaO_3$, $GdTiO_3$, $LaGaO_3$, $PrAlO_3$, $NdAlO_3$, $NdGaO_3$, $GdAlO_3$, $Al2O_3$, $DyScO_3$, $CaZrO_3$, $MgO$, $CaO$, $ZnO$, $TiO_2$, $ZrO_2$, $HfO_2$ and $VO_2$.

According to some embodiments of the invention the said non-polar crystalline layer is $SrTiO_3$ terminated by $TiO_2$.

According to some embodiments of the invention the said interface is at a (100) crystallographic plane of said non-polar crystalline layer.

According to some embodiments of the invention the polar crystalline layer is at least 4 unit cells in thickness.

The heterostructure system optionally and preferably can be utilized in may applications, including, without limitation, integrated circuits, logic circuits (e.g., CMOS logic circuit, an nMOS logic circuit, and a pMOS logic circuit), field effect transistors, imaging systems (e.g., CMOS imagers), sensor systems (e.g., CMOS sensors), light emission systems, solar cell systems and the like.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF SEVERAL VIEWS OF THE DRAWINGS

The patent or application file contains at least one drawing executed in color. Copies of this patent or patent application publication with color drawing(s) will be provided by the Office upon request and payment of the necessary fee.

Some embodiments of the invention are herein described, by way of example only, with reference to the accompanying drawings ad images. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

Figure 1:
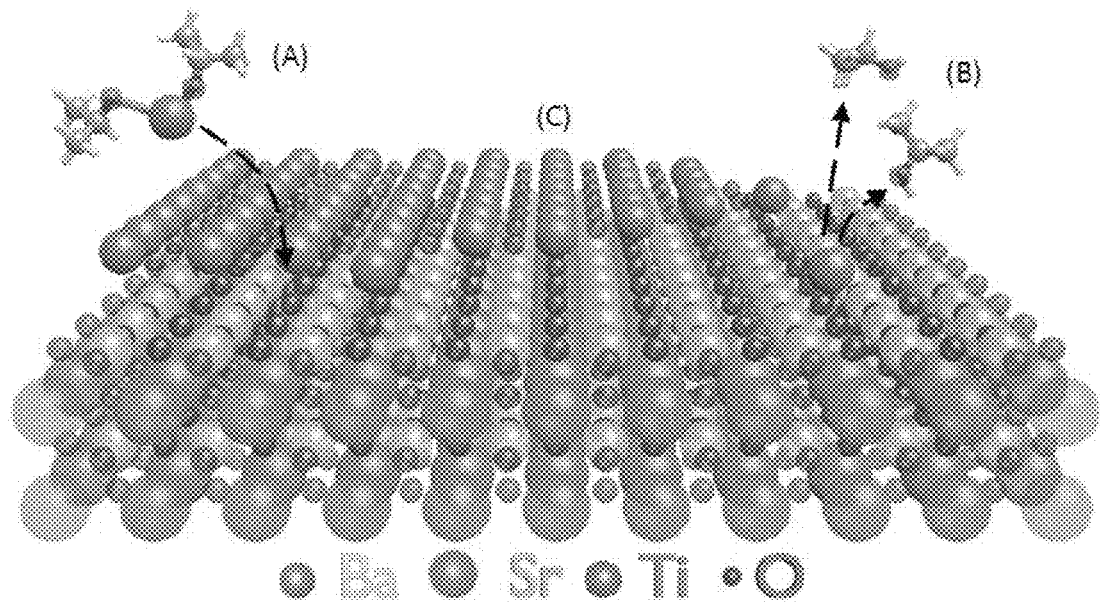

FIG. 1 is a schematic illustration of a solution monolayer epitaxy process. $TiO_2$ terminated $SrTiO_3$ is submersed in a solution of $Ba^{II}$ isopropoxide (A) in ethylene glycol, which In some embodiments of the present invention is kept slightly below the decomposition temperature of the precursor $Ba^{II}$ isopropoxide. Surface catalysis results in decomposition of the precursor, which results in epitaxial deposition of BaO on the surface (B). This process is self-terminated when a complete layer of BaO covers the surface (C).

Figures 2A, 2B:
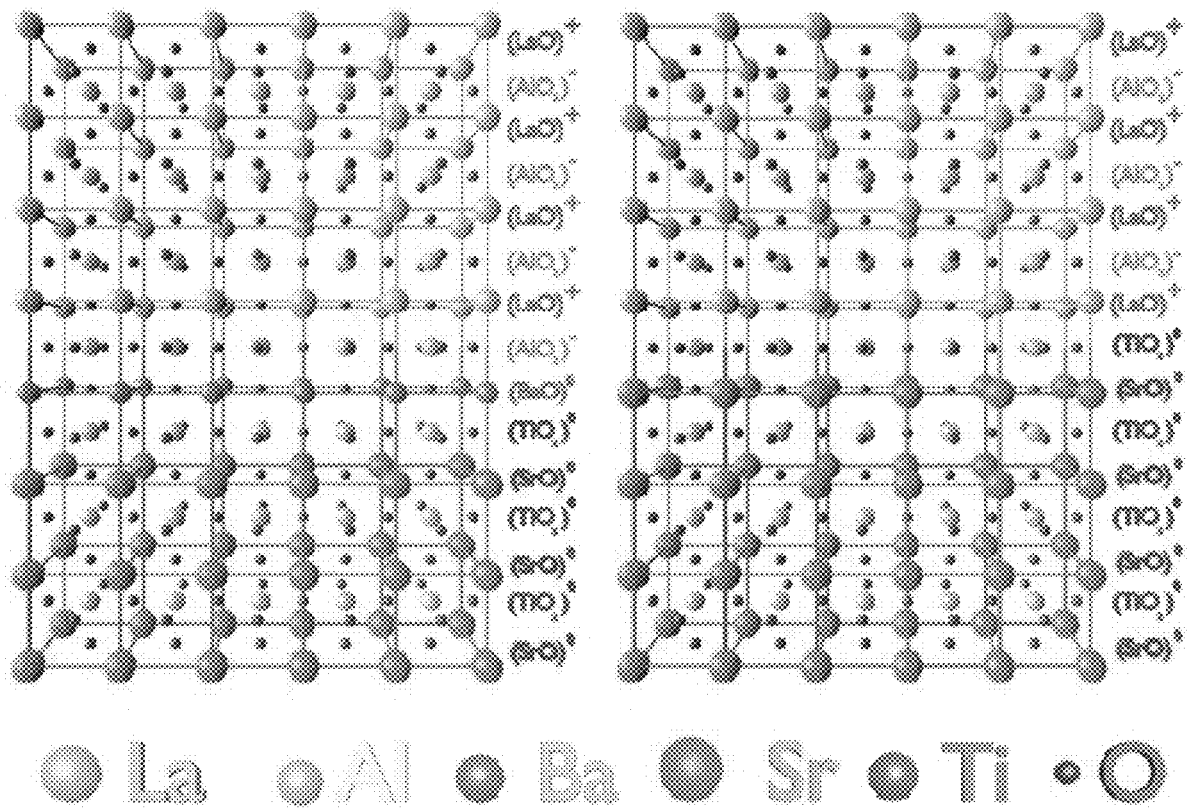

FIGS. 2A and 2B are schematic illustrations of two models of $SrTiO_3/LaAlO_3$ interfaces. FIG. 2B illustrates an n-type interface. FIG. 2A illustrates a p-type interface according to some embodiments of the present invention. The p-type interface incorporates a monolayer of BaO between the $SrTiO_3$ substrate and a polar $LaAlO_3$ film. The presence of the Ba film forces a growth with inverted $LaAlO_3$ polarity.

Figure 3A:
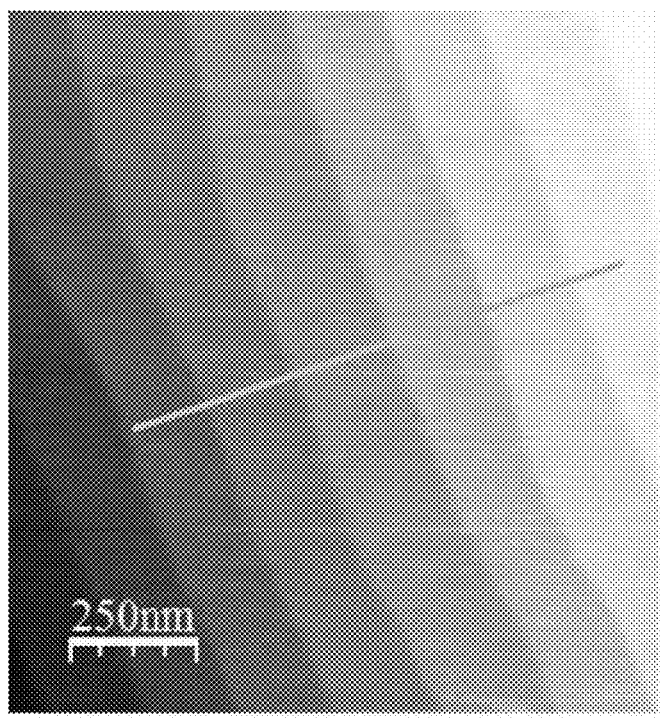

FIG. 3A is an AFM topography image of a surface fabricated according to some embodiments of the present invention after solution monolayer epitaxy deposition of Ba, the terraces are 1 uc high and singly terminated.

Figure 3B:
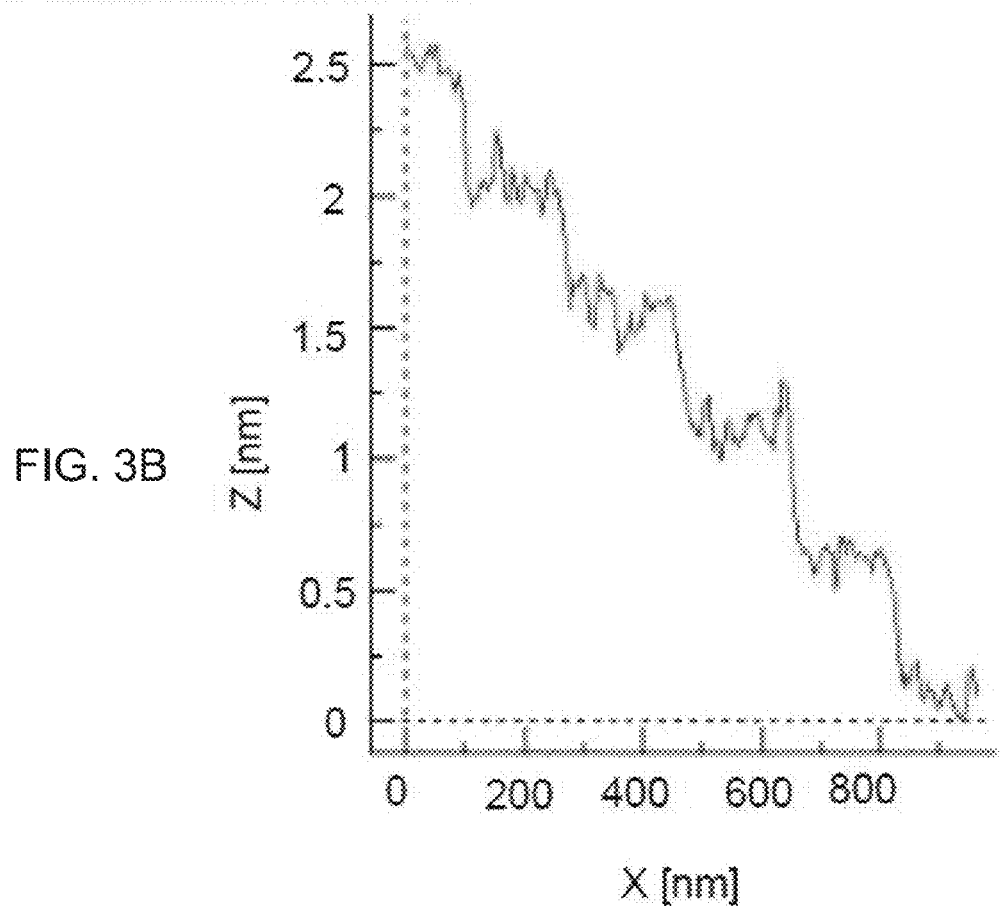

FIG. 3B is a graph taken along the line shown in FIG. 3A.

Figure 3C:
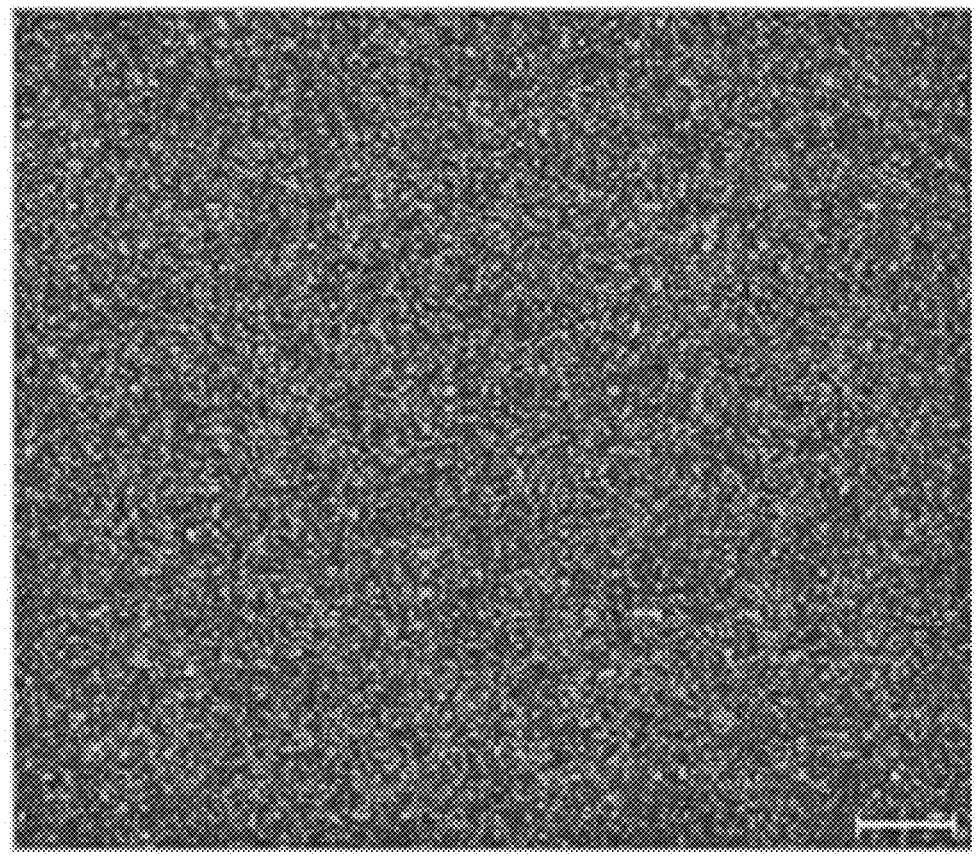

FIG. 3C shows a TOF-SIMS element mapping of Ba. As shown, the coverage of Ba is uniform across the sample.

Figure 4A:
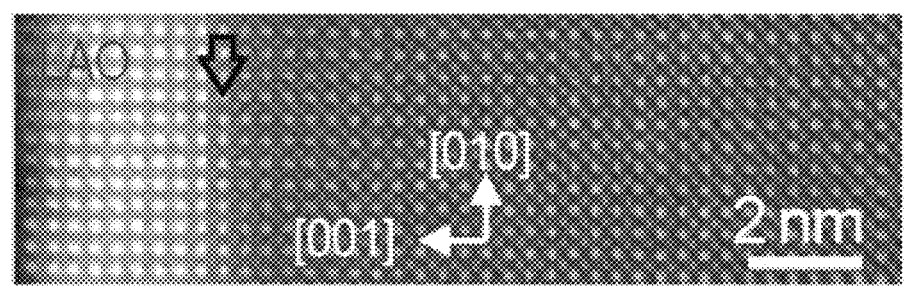
Figure 4B:
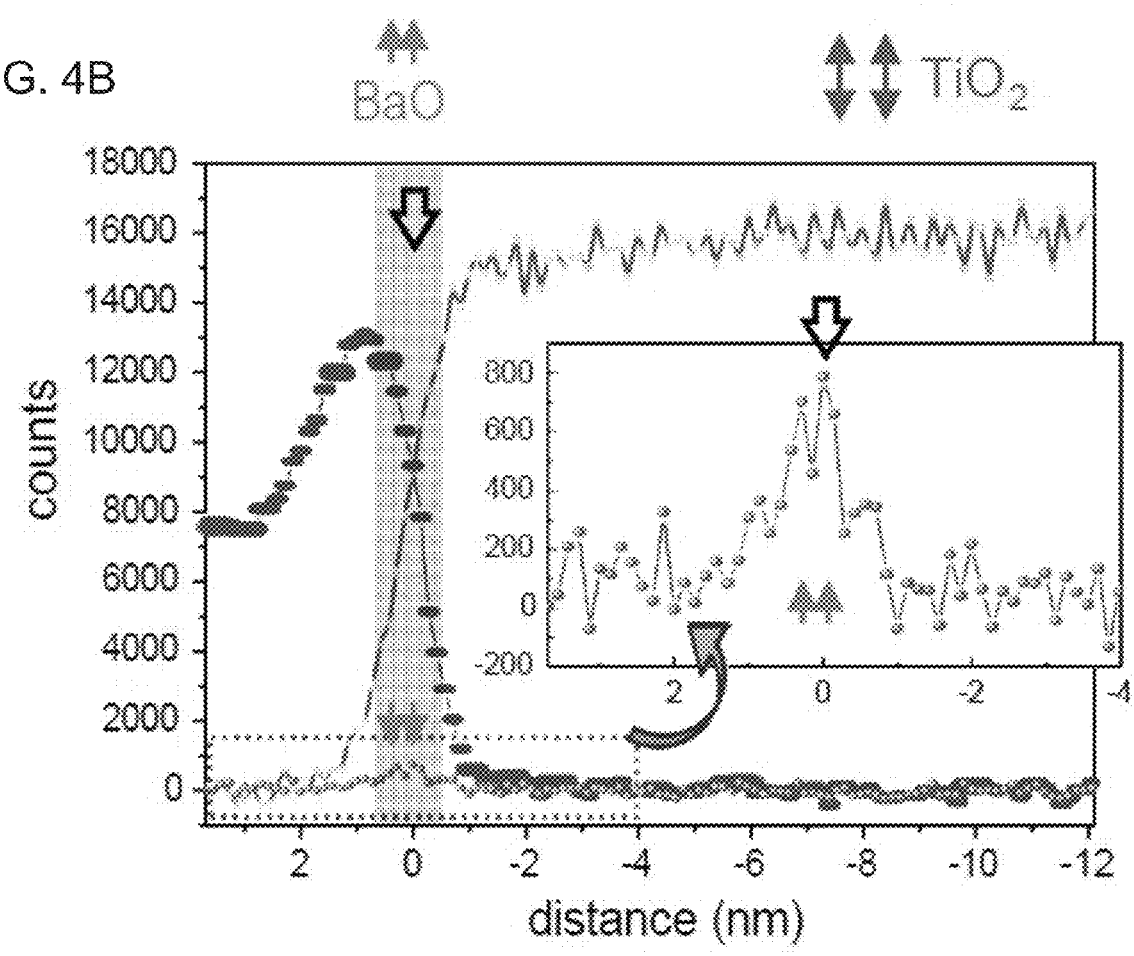

FIGS. 4A and 4B show atomic-resolution Z-contrast image and elemental dispersion, as obtained according to some embodiments of the invention for a $LaAlO_3/BaO/SrTiO_3$ heterostructure. The measurements were made along the [100] crystallographic direction of a $SrTiO_3$ substrate. FIG. 4A is high-angle annular dark-field image recorded before the EELS measurement showing the contrast difference between the $LaAlO_3/BaO$ and the $SrTiO_3$. The interface between the $LaAlO_3/BaO$ and the $SrTiO_3$ substrate is marked by a black arrow. FIG. 4B includes intensity line profiles of Ti $L_3$ (red), Ba $M_4$, (green), and La $M_5$ (blue) edges, plotted as a function of the distance away from the interface (marked by the black arrow), showing the elemental dispersions along the [001] growth direction of the $LaAlO_3/BaO/SrTiO_3$ heterostructure. The profiles were obtained by using integrated intensity from the energy-loss window ranging from 464.8 to 466.8 eV for Ti, from 801 to 804.2 eV for Ba, and from 834.4 to 836 eV for La, respectively. Intensity modulations of Ti are evident; the peaks represent the real stacking of $TiO_2$ planes as indicated by the red double-headed arrows. The maximum interdiffusion width, shadowed in light blue, was estimated to be 3 perovskite unit cells. The Inset of FIG. 4B is a magnification of the intensity profile showing the modulation of Ba signal (denoted by green arrows) from the region indicated by the dotted rectangle.

FIGS. 5A-D shows transport properties of $SrTiO_3/BaO$ $LaAlO_3$ interface. FIG. 5A shows resistance as function of temperature, FIG. 5B shows the Hall resistance measured as function of magnetic field for various gate voltages, FIG. 5C shows carrier density as function of the gate voltage as calculated from a low field Hall coefficient, and FIG. 5D shows longitudinal resistance function of the gate voltage. A decrease in resistance is observed for increasing and decreasing of gate voltage.

Figure 6:
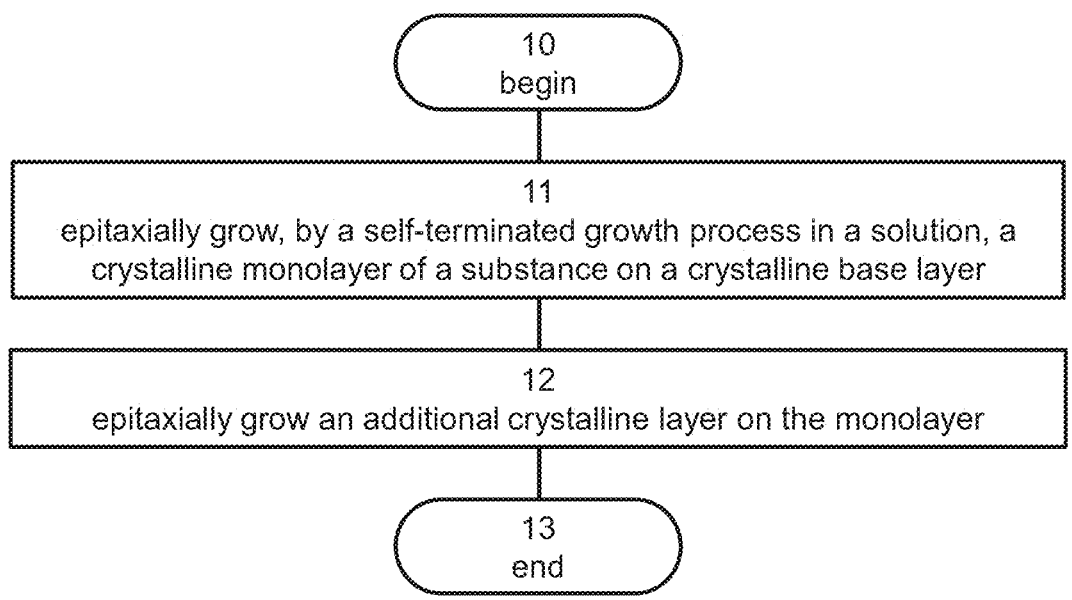

FIG. 6 is a flowchart diagram of a method suitable for fabricating a heterostructure system according to various exemplary embodiments of the present invention.

Figure 7:
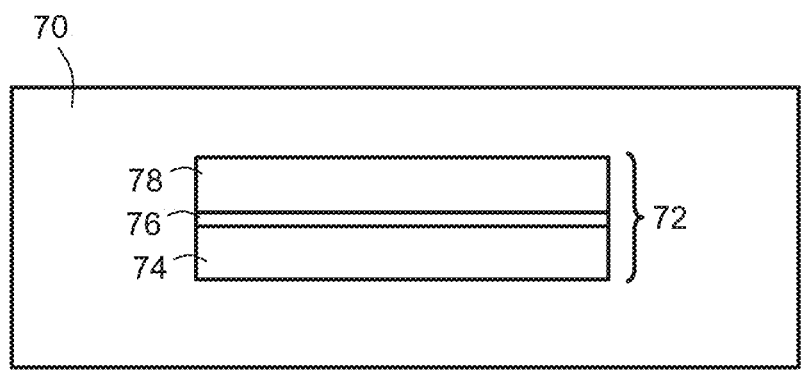

FIG. 7 is a schematic illustration of an electronic system, according to some embodiments of the present invention.

DESCRIPTION OF SPECIFIC EMBODIMENTS OF THE INVENTION

The present invention, in some embodiments thereof, relates to heterostructures and, more particularly, but not exclusively, to a heterostructure system having an oxide interface, to a method of fabricating such a heterostructure system, and to a system incorporating such a heterostructure system.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

FIG. 6 is a flowchart diagram of a method suitable for fabricating a heterostructure system according to various exemplary embodiments of the present invention. It is to be understood that, unless otherwise defined, the operations described hereinbelow can be executed either contemporaneously or sequentially in many combinations or orders of execution. Specifically, the ordering of the flowchart diagrams is not to be considered as limiting. For example, two or more operations, appearing in the following description or in the flowchart diagrams in a particular order, can be executed in a different order (e.g., a reverse order) or substantially contemporaneously. Additionally, several operations described below are optional and may not be executed.

The method begins at 10 and continues to 11 at which a crystalline layer of a substance, referred to herein as "the first substance" is epitaxially grown on a crystalline base layer. The growth is optionally and preferably by surface catalysis in a solution, and is preferably self-terminated. The solution typically comprises a precursor substance that produces the first substance, and a solvent containing the precursor substance. Typically, but not necessarily, the growth is self-terminated once a monolayer of the first substance is formed on the base layer.

As used herein, "epitaxial growth" refers to a growth of crystalline layer on a surface of another crystalline layer or a crystalline substrate in which the crystal of the growing layer adopts the crystallographic orientation of the crystal that terminates at the surface.

Optionally, but not necessarily, the interface between the crystalline layer of the first substance and the base crystalline layer is at a (100) crystallographic plane of the base crystalline layer.

In some embodiments of the present invention the crystalline layer of the first substance forms a perovskite crystal structure with a surface of the crystalline base layer. In some embodiments, the perovskite structure is an oxide.

As used herein "perovskite" designate metal oxides having an ideal and non-ideal perovskite crystalline structure. The ideal perovskite crystalline structure is defined by the empirical formula $ABO_3$, in which A and B are cations of different metals and in which the A cation is coordinated to 12 oxygen atoms while the B cation occupies octahedral sites and is coordinated to 6 oxygen atoms. The ideal perovskite structure is cubic, while the non-ideal perovskite structure is not necessarily a cubic structure. The algebraic sum of the ionic charges of the two metals (cations) of the perovskite typically equals 6.

As used herein "formula unit," refers to a physical structure which is the minimal whole-number division of a unit cell of a crystalline structure. Thus, a unit cell of a crystalline structure is composed of an integer multiple (oftentimes denoted Z in the scientific literature) of formula units. This definition encompasses also the special case in which the integer multiple Z equals 1, in which case the unit cell of the respective crystalline structure is composed of a single formula unit.

The first substance typically comprises an element selected from the group consisting of barium, strontium, calcium, magnesium, zinc, titanium, aluminum, zirconium, hafnium, tantalum, vanadium, niobium, manganese, chromium, iron, nickel and cobalt. Typically, the first substance is an oxide. For example, when the first substance comprises barium, it can be barium oxide, when the first substance comprises strontium, it can be strontium oxide, when the first substance comprises titanium, it can be titanium oxide, etc.

The precursor substance is selected based on the desired first substance. Specifically, the precursor substance is selected such that a surface catalysis process in the presence of the crystalline base layer catalyzes a decomposition of the precursor, resulting in deposition of the first substance on the crystalline base layer. For example, when the first substance comprises barium (e.g., barium oxide), the precursor substance can be a barium derivative, such as, but not limited to, barium isopropoxide, when the first substance comprises strontium (e.g., strontium oxide), the precursor substance can be a strontium derivative (e.g., strontium isopropoxide), and when the first substance comprises titanium (e.g., titanium oxide), the precursor substance can be a titanium derivative, such as, but not limited to, titanium isopropoxide, titanium(IV) diisopropoxidebis(2,2,6,6-tetramethyl-3,5-heptanedionate), and titanium(IV) (triethanolaminato)isopropoxide.

The crystalline base layer can be made of an electrically insulating material. In various exemplary embodiments of the invention the crystalline base layer comprises an oxide. For example, in some embodiments of the present invention the crystalline base layer comprises strontium titanate, $SrTiO_3$, and is optionally and preferably terminated by titanium dioxide, $TiO_2$. In these embodiments, the first substance optionally and preferably, but not necessarily, comprises barium, and more preferably, barium oxide.

Other types of substrates that are contemplated for use as the crystalline base layer according to some embodiments of the present invention, include, without limitation, a semiconductor substrate containing a group III element of the periodic table, and a substrate containing a III-V semiconductor alloy, namely an alloy which comprises at least one element from group III of the periodic table and at least one element which comprises V of the periodic table. Optionally, the semiconductor or semiconductor alloy is terminated, preferably by an oxide.

Exemplary useful group-III elements include, but are not limited to, gallium, indium, thallium and aluminum; and exemplary useful group-V elements include, but are not limited to, arsenic, antimony and phosphorous. Non-limiting examples of III-V semiconductor alloys suitable for the present embodiments include binary III-V semiconductor alloys, such as, but not limited to, InAs, InSb, InP GaSb, GaAs and AlSb, ternary III-V semiconductor alloys such as, but not limited to, InGaAs, InAsSb, InAsP, AlInAs, AlAsSb, GaAsP and InSbP, and quaternary semiconductor alloys such as, but not limited to, GaInAsSb.

As a representative example, which is not intended to be limiting, the crystalline base layer can be a InSb, InAs or GaAs. In these embodiments, the first substance optionally and preferably, but not necessarily, comprises titanium, more preferably titanium oxide.

The solvent can be of any type suitable for surface catalysis in a solution. A representative and non-limiting example includes a polyol, such as, but not limited to, ethylene glycol. Another representative and non-limiting example includes an organic solvent such as, but not limited to, octadecene.

Preferably, the solution is a non-aqueous solution, and more preferably an anhydrous solution.

As used herein "anhydrous" describes a solution or gaseous environment that contains less than 5% or less than 4% or less than 3% or less than 2% or less than 1% or less than 0.5% or less than 0.1% water by weight.

Preferably, 11 is executed in an anhydrous environment. This can be done, for example, by immersing the crystalline base layer in the solution within a sealed container enclosing therein an anhydrous environment. Typically, but not necessarily, the container is filled with an inert gas, such as, but not limited to, nitrogen.

The advantage of using an anhydrous solution, and optionally also executing 11 in an anhydrous environment, is that it reduces or prevents any catalysis that may compete with the surface catalysis. Specifically, low amount (e.g., absence) of water molecules, can reduce or prevent the decomposition of the precursor substance into particles that may deposit to form a multilayer on the crystalline base layer.

Operation 11 can be executed at room temperature (e.g., from about 20° C. to about 25° C.), or at a temperature which is slightly below (e.g., less than 5 degrees or less than 3 degrees or less than 1 degree) the decomposition temperature of the precursor.

The self-termination of the growth is explained with reference to FIG. 1, for the case in which the grown monolayer is a BaO monolayer, and crystalline base layer is a $TiO_2$-terminated $SrTiO_3$. While the process is described with a particular emphasis to these combinations of substances, it is to be understood that use of other substances is also contemplated. In the illustrated embodiment, the crystalline base layer (a $TiO_2$-terminated $SrTiO_3$ in the present example) is submersed in a solution containing a precursor substance (a barium-containing precursor in the present example). For example, a solution of $Ba^{II}$ isopropoxide (shown at A in FIG. 1) in ethylene glycol can be used. In some embodiments of the present invention the solution is kept slightly below (e.g., less than 5 degrees or less than 3 degrees or less than 1 degree) the decomposition temperature of the precursor substance ($Ba^{II}$ isopropoxide in the present example). Surface catalysis in the presence of the crystalline base layer ($TiO_2$-terminated $SrTiO_3$ in the present example) results in decomposition of the precursor substance, which results in epitaxial deposition of the first substance (BaO in the present example) on the surface of the crystalline base layer (shown at B in FIG. 1). When a complete layer of BaO covers the surface, this process is self-terminated (C).

It was found by the inventors of the present invention that a self-terminated growth by surface catalysis in a solution in which the growth is terminated when the first substance covers a crystalline layer can provide a monolayer of high uniformity in terms of its thickness. Thus, in various exemplary embodiments of the invention the crystalline layer of the first substance, has a thickness of one atom of the first substance over at least 95% or at least 96% or at least 97% or at least 98% or at least 99% or at least 99.9% of the of the area of base layer, e.g., the entire area of base layer.

It is appreciated that when the first substance is a multi-atom substance, the term "thickness of one atom" refers to a thickness of the largest atom of the multi-atom substance. For example, when the first substance is an oxide in the form AO, in which A is an atom bonded to an oxygen O, the term "thickness of one atom" refers to the thickness of the A atom. In a more specific example in which the first substance is a barium oxide, the term "thickness of one atom" refers to a thickness of a barium atom (e.g., 400-500 pm).

In some embodiments of the present invention the crystalline layer of the first substance forms a half unit cell with a surface of crystalline base layer on which crystalline layer of first substance layer is grown.

In some embodiments of the present invention the interface between the layer of the first substance and the base layer constitutes mobile charge carriers. Preferably, the interface constitutes both holes and electrons.

Operation 11 can optionally executed more than once, preferably each time using a different precursor substance thereby forming two or more monolayers of different substances. As a representative example, a first execution of operation 11 can employ a titanium derivative (e.g., titanium isopropoxide as further detailed hereinabove) as the precursor substance and a semiconductor alloy (e.g., InSb, InAs, GaAs, as further detailed hereinabove) as the crystalline base layer to provide a titanium oxide termination layer on the semiconductor alloy, and a second execution of operation 11 can employ a barium derivative (e.g., barium isopropoxide as further detailed hereinabove) or a strontium derivative (e.g., strontium isopropoxide as further detailed hereinabove) as the precursor substance and the titanium oxide-terminated semiconductor alloy as the crystalline base layer to provide a barium oxide monolayer on the terminated semiconductor alloy.

The method optionally and preferably continues to 12 at which an additional crystalline layer is epitaxially grown on the monolayer, to form a heterostructure system comprising the base layer, the additional layer and the monolayer interposed between the base layer and the additional layer. In some embodiments of the present invention the additional layer is at least 4 unit cells or at least 6 unit cells or at least 8 unit cells or at least 10 unit cells or at least 12 unit cells in thickness.

The growth 12 can be by any technique known in the art, including, without limitation, physical deposition and chemical deposition (e.g., atomic layer deposition or solution atomic layer deposition).

The additional crystalline layer grown at 12 is preferably made of a substance, referred to herein as the second substance, that is different to the first substance and optionally and preferably also different to the base layer. In some embodiments of the present invention the additional layer is made of an electrically insulating material. Preferably, the additional layer has a perovskite crystal structure, e.g., an oxide. These embodiments are contemplated also when the base layer has a perovskite crystal structure. For example, both the additional layer and the base layers can comprise an oxide. Representative examples of substances suitable for use as the second substance including, without limitation, $LaTiO_3$, $LaAlO_3$, $LaVO_3$, $KTaO_3$, $GdTiO_3$, $LaGaO_3$, $PrAlO_3$, $NdAlO_3$, $NdGaO_3$, $GdAlO_3$, $Al_2O_3$, $DyScO_3$, $CaZrO_3$, MgO, CaO, ZnO, $TiO_2$, $ZrO_2$, $HfO_2$ and $VO_2$. These embodiments are particularly useful when the crystalline base layer comprises $SrTiO_3$.

The method ends at 13.

It was found by the present inventors that the crystalline layer of the first substance can serve as a polarity inversion layer, particularly, but not necessarily, when the crystalline base layer is a non-polar crystalline layer. In these embodiments, the additional crystalline layer can be a polar crystalline layer that exhibits polarity which is inverted relative to a polarity that would have been exhibited by it in the absence of the polarity inversion layer.

As used herein a crystalline layer is referred to as "non-polar" when the electrical charges are distributed uniformly across the layer.

As used herein a crystalline layer is referred to as "polar" when the crystalline layer has an alternate sequence of sublayers of opposite electrical charges. The sublayers of a polar crystalline layer can, in some embodiments, have a thickness of half unit cell.

A representative example of a nonpolar crystalline layer is a crystalline layer composed of a sequence of electrically neutral atomic planes.

A representative example of a polar crystalline layer is a crystalline layer composed of a sequence of alternately charged atomic planes.

As used herein, "polarity inversion layer" refers to a layer that induces on a polar crystalline layer polarity which is inverted relative to a polarity that would have been exhibited by the polar crystalline layer in the absence of the polarity inversion layer.

The polarity inversion property of the crystalline layer of the first substance is explained with reference to FIGS. 2A and 2B, for the case in which the grown monolayer is a BaO monolayer, the crystalline base layer is a $TiO_2$-terminated $SrTiO_3$ layer, and the additional crystalline layer is a $LaAlO_3$ layer. While these embodiments are described with a particular emphasis to these combinations of substances, it is to be understood that use of other substances is also contemplated. FIG. 2B illustrates an interface between a $TiO_2$-terminated $SrTiO_3$ structure and a $LaAlO_3$ structure, in the absence of the monolayer. As shown, there is a positively charged LaO interface between the two structures, making the interface an n-type interface. FIG. 2A illustrates a preferred embodiment in which the Ba monolayer is between a $TiO_2$-terminated $SrTiO_3$ layer and a $LaAlO_3$ layer. As shown, the presence of the BaO monolayer forces a growth with inverted $LaAlO_3$ polarity, making the interface a p-type interface with a negatively charged AlO.

The crystalline layer of the first substance can alternatively serve as a passivation layer for the crystalline base layer, for example, in cases in which the crystalline base layer is sensitive to the ambient environment, and it is desired to isolate this surface from the ambient environment. A representative example of such a case is an embodiment in which the crystalline base layer comprises a semiconductor or a semiconductor alloy. When the crystalline base layer is employed in an electronic device, the crystalline layer of the first substance can also serve as a dielectric barrier for device fabrication and/or for reducing leakage currents in from and to the crystalline base layer.

FIG. 7 is a schematic illustration of an electronic system 70, according to some embodiments of the present invention. System 70 comprises one or more heterostructure systems 72, and can be configured as, for example, a Complementary Metal-Oxide Semiconductor (CMOS) system, an integrated circuit system, a logic circuit system (e.g., a CMOS logic circuit, an nMOS logic circuit, a pMOS logic circuit), a field effect transistor, an imaging system, a sensor system, a light emission system, a solar cell system, and the like. Each of heterostructure systems 72 can include a crystalline base layer 74 as further detailed hereinabove, a crystalline layer 76 made of the first substance and being epitaxially grown on base layer 74 as further detailed hereinabove, and optionally and preferably, but not necessarily, also an additional layer 78 made of the second substance and being grown on layer 76 as further detailed hereinabove. In some embodiments of the present invention at least one, e.g., each, of heterostructure systems 72 is manufactured by the method described above with reference to FIG. 6.

As used herein the term "about" refers to ±10%.

The word "exemplary" is used herein to mean "serving as an example, instance or illustration." Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments." Any particular embodiment of the invention may include a plurality of "optional" features unless such features conflict.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Various embodiments and aspects of the present invention as delineated hereinabove and as claimed in the claims section below find experimental support in the following examples.

EXAMPLES

Reference is now made to the following examples, which together with the above descriptions illustrate some embodiments of the invention in a non limiting fashion.

Epitaxial growth of atomically-sharp interfaces serves as one of the main building blocks of nanofabrication. Such interfaces are useful for the operation of various devices including transistors, photo-voltaic cells, and memory components. In order to avoid charge traps that may hamper the operation of such devices, it is desired for the layers to be atomically-sharp. Fabrication of atomically sharp interfaces normally requires ultra-high vacuum techniques and high substrate temperatures.

In the present Example, a self-terminating wet chemical process for deposition of epitaxial layers from alkoxide precursors is described. This method is fast, cheap, and yields perfect interfaces as validated by various analysis techniques described herein. It allows the design of heterostructures with half-unit cell resolution. The Example demonstrates the method of the present embodiments by designing a hole-type oxide interface $SrTiO_3/BaO/LaAlO_3$. The Example shows that transport through this interface exhibits properties of mixed electron-hole contributions with hole mobility exceeding that of electrons.

Growth methods of epitaxial thin films can be roughly categorized as physical and chemical. While physical methods (e.g. molecular beam epitaxy, pulsed laser deposition (PLD)) are based on creating a beam of the film material and transporting it in vacuum onto the substrate. Chemical methods such as: chemical vapor deposition and atomic layer deposition (ALD) use a chemical precursor, a compound containing the film growth material. The precursor is transferred in vacuum onto the substrate, where the surface catalyzes the precursor dissociation reaction, and the deposition of the film. While giving very good results for film growth, these methods lack the versatility and become increasingly complex when a wide variety of surface monolayers is required.

In the Solution monolayer epitaxy (SoME) which was used in the present Example, and which is useful in any embodiment of the present invention, the substrate of choice, in this case a (100) $TiO_2$ terminated $SrTiO_3$, was submersed in a solution of a dissolved precursor of choice, at a temperature slightly lower than its decomposition temperature. Under these conditions the precursor molecules did not decompose in the solution unless they were in close proximity to the surface of the substrate, which catalyzes the decomposition of the precursor and the required material resulting in a monolayer.

In the present Example, SoME was used to grow a BaO monolayer (termination) on a $SrTiO_3$ substrate as described in FIG. 1. Then, an additional epitaxial layer of $LaAlO_3$ was grown using traditional pulsed laser deposition, providing a $SrTiO_3/BaO/LaAlO_3$ structure as depicted in FIG. 2A for comparison the standard $SrTiO_3/LaAlO_3$ interface is shown in FIG. 2B. More details of the process are found in the methods section, below.

Oxide interfaces can combine degrees of freedom from their constituents with emergent phenomena such as, superconductivity magnetism tunable spin-orbit interaction and quantum transport. The appearance of conductivity in the hallmark interface between $LaAlO_3$ and $SrTiO_3$ has been explained as a result of stacking polar layers of $LaAlO_3$ thus accumulating potential energy. According to these scenarios one expects the two interfaces presented in FIG. 2B to have carriers of opposite signs.

Prior to the $LaAlO_3$ deposition the SoME BaO deposited layer was characterized using an atomic force microscope (AFM) and time of flight secondary ion mass spectroscopy (TOF-SIMS), see FIG. 3A-C. FIG. 3A shows an AFM topography image of the surface, a smooth surface is observed indicating full coverage of the substrate. FIG. 3B shows a spatial distribution map of Ba as measured by TOF-SIMS showing a uniform distribution of Ba on the surface. The combination of these two techniques shows that the inventors indeed created a smooth single terminated BaO layer on top of the $SrTiO_3$ substrate.

FIG. 4A shows an atomic-resolution high-angle annular dark-field (HAADF) image of the $SrTiO_3/BaO/LaAlO_3$ heterostructure taken from the [100] direction of $SrTiO_3$, whose contrast is roughly proportional to the square of the mean atomic number Z in the atomic columns. Based on the image contrast, the interface between $SrTiO_3$ and $BaO/LaAlO_3$ was identified and marked by the black arrow. The dark contrast on the right side of the interface corresponds to the $SrTiO_3$ substrate since it possesses much smaller Z numbers with respect to those of BaO and $LaAlO_3$. In the left area, the $LaAlO_3$ and BaO show very bright contrast. However, distinguishing BaO from $LaAlO_3$ in the HAADF image is difficult because the atomic numbers $Z_{Ba}=56$, $Z_{La}=57$ are almost the same.

FIG. 4B displays the intensity line profiles of Ti $L_2$, Ba $M_4$, and La $L_5$ edges extracted from the background subtracted electron energy-loss spectroscopy (EELS) dataset, plotted as a function of the distance away from the interface, allowing to explore the dispersion of elements along the [001] growth direction of $LaAlO_3/BaO/SrTiO_3$ heterostructure. Intensity modulations are evident in the Ti and Ba (inset of FIG. 4B) line profiles, where the modulated peak positions represent the real stacking of the $TiO_2$ and BaO layers, as indicated by the red and green arrows, respectively. This reveals a unique match between the simultaneously recorded HAADF and the EELS stack images. The irradiation damage induced by the electron source, although carefully minimized, inevitably results in a collapse of the near surface structure of $LaAlO_3$ and leads to the drop of La intensity in FIG. 4B. Based on the intensity modulation of Ba, the location of the BaO layers were identified. These appear to be confined within two atomic layers at the $LaAlO_3/SrTiO_3$ interface (inset of FIG. 4B).

By using the intensity modulation as a reference, the width of the interface can also be estimated as to be three perovskite unit cells, shadowed in light blue of FIG. 4B. Considering the unavoidable broadening effect induced by shape of the electron probe and/or its tail, this value can be regarded as an upper limit of the chemical interdiffusion in the $LaAlO_3/BaO/SrTiO_3$ heterostructure.

Unlike thin film deposition techniques using dissolved organic precursors, which showed non epitaxial, the monolayer of the present embodiments shows high epitaxial quality.

FIG. 5A shows the sheet resistance $R_\square$ of a typical sample measured as a function of temperature. As shown, $R_\square$ decreases with temperature, indicating that the interface is metallic. In FIG. 5B The Hall resistance as function of magnetic field is shown for various gate voltages. The slope of the Hall signal, the Hall coefficient $R_H$, is negative, corresponding to negative charge carriers. $(eR_H)^{-1}$ is plotted versus gate voltage in FIG. 5C. In a naive, single band, picture the slope of the classical Hall effect is related to the charge carrier density by: $n=1/eR_H$. Note that the inferred density n increases when applying negative gate voltage. This behavior is in contrast to what is expected from gating an electron doped sample. FIG. 5D shows $R_\square$ as function of gate voltage. As shown the behavior is monotonic.

The gate voltage dependence of $R_H$ and $R_\square$ provide evidence for the existence of both holes and electrons at the interface. As shown in FIG. 5C, $R_H^{-1}$ increases by orders of magnitude when applying negative gate voltages, in contrast to the expected behavior of n-type interface. Furthermore $R_\square$ is non-monotonic with gate voltage and has a maximum at $V_g=2V$.

In the frame of bipolar transport of electrons with density n and mobility $\mu_n$ and holes with density p and mobility $\mu_p$ in the low field limit $R_H$ takes the form:

$$R_H=(p\mu_p^2-n\mu_n^2)/e(p\mu_p+n\mu_n)^2.$$

When the condition $n\mu_n^2>p\mu_p^2$ is satisfied, the Hall signal is negative, as demonstrated in the measurements. Upon applying negative gate voltage n decreases and p increases. This results in effectively decreasing $|R_H|$. Furthermore, $R_{S\square}$ behaves non-monotonically with gate voltage. In $SrTiO_3/LaAlO_3$ interfaces decreasing electron density results in lowering of electron mobility, which result in strong increase of the resistance. Therefore the decreasing resistance observed at $V_g<2V$ can be explained by accumulation of holes.

A close inspection of the data suggests that $\mu_p>\mu_n$. For a symmetric electron-hole system the neutrality point typically appears at the same gate voltage as the resistance maximum. In the system the maximum in resistance appears where the sign of $R_H$ is negative, $(p\mu_p^2<n\mu_n^2)$. Assuming that the geometrical capacitance for both carriers is the same a decrease in n is accompanied by an identical increase in p. Therefore, the decrease in resistance for decreasing gate voltage below $V_g=2V$ is preferably in a regime where $\mu_p>\mu_n$ whereas the regime above $V_g=2V$ is preferably with $\$\mu_p<\mu_n$.

There are many mechanisms that can create n-type doping in $SrTiO_3$ except for the polar scenario including: oxygen vacancies and cation mixing close to the interface during film growth. However, none of these mechanisms can be responsible for hole doping. Without being bound to any particular theory, it is concluded that the polar structure of the samples is responsible for hole doping.

The present Example demonstrates utilization of surface catalysis in solution for the deposition of crystalline oxide layers according to preferred embodiments of the invention. The method of the present embodiments does not require high temperature environments and it can be used instead of, or in addition to, expensive physical deposition techniques. The great variety of organic precursors make the method of the present embodiments versatile and suitable for wide range of materials. To demonstrate the method, a BaO layer was grown on top of a $TiO_2$ terminated $SrTiO_3$. An additional $LaAlO_3$ layer was then deposited using PLD to realize a nominally p-type interface. The transport measurements of this new interface was interpreted in the framework of bipolar conductivity where both electrons and mobile holes exist at the interface and can be controlled by gate voltage.

EXPERIMENTAL METHODS

Solution Monolayer Epitaxy of BaO Monolayer

In a typical preparation, inside a nitrogen-filled glovebox, about 10 mg of $Ba^{(II)}$-isopropoxide (Sigma-Aldrich, 99.9%) were weighed and subsequently suspended in 20 mL of anhydrous ethylene glycol (Sigma-Aldrich 99.8%) in a glass vial. The vial was carefully sealed and taken out of the glovebox. It was then sonicated for 5 minutes in order to completely dissolve the barium isopropoxide in the ethylene glycol. The solution was then transferred to a round-bottom flask and a clean $TiO_2$-terminated $SrTiO_3$ substrate was submersed in it. The flask was then purged three times with nitrogen and heated to 198° C., (reflux) under constant nitrogen flow. After 30 minutes the flask was let to cool back to room temperature and then opened. The substrate was then washed with acetone and isopropanol to remove the excess solution.

Pulsed Laser Deposition and Measurements

Epitaxial layers of $LaAlO_3$ were grown using reflection high energy electron diffraction monitored PLD on atomically flat BaO terminated {100} $SrTiO_3$ 0.5 mm thick substrates in standard conditions, oxygen partial pressure of $10^{-4}$ Torr and temperature of 780° C., as described in Bert et al., Nature physics 7, 767 (2011), the contents of which are hereby incorporated by reference.

Gold gate electrodes were evaporated to cover the back of the substrate. The leakage current is less than 1 pA. The measurements were performed in a dilution refrigerator with a base temperature of 20 mK at magnetic fields of up to 18 Tesla at various gate voltages at Tallahassee National High Magnetic Field Laboratory. Transport results were reproduced for 9, 10 and 12 unit cells samples.

Sample Preparation for Scanning Transmission Electron Microscopy

<100>orientated cross-sectional lamellae were prepared using a focused ion beam milling FEI Helios NanoLab 400S dual-beam system. The lamellae were thinned by Ar ion milling at 2.5 kV in a Bal-Tec RES-101 system, followed by a 500 eV Ar ion milling to remove the damaged surface layers introduced by previous procedure with a Fischione NanoMill 1040 system.

Scanning Transmission Electron Microscopy

The atomic-resolution HAADF and EELS investigations were performed on an FEI Titan 80-300 microscope equipped with a spherical aberration corrector for the electron probe, running at 300 kV. In STEM mode, a probe size of about 0.1 nm and a semi-convergence angle of 25 mrad were utilized. For HAADF imaging, the inner collecting angle was 70 mrad. For EELS signal collection, the camera length parameter was set to a value of 48 mm, together with a 6.0 mm entrance aperture resulting in a semi-collection angle of about 40 mrad.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

REFERENCES

[1] H. M. Smith and A. Turner, Applied Optics 4, 147 (1965).

[2] C. Ma, K.-C. Kim, G. McFarlane, and A. Athalye, in Advanced Semiconductor Manufacturing Conference, 2008. ASMC 2008. IEEE/SEMI (IEEE, 2008), pp. 82-84.

[3] Reyren et al., Science 317, 1196 (2007).

[4] Caviglia et al., Nature 456, 624 (2008).

[5] M. Ben Shalom, C. Tai, Y. Lereah, M. Sachs, E. Levy, D. Rakhmilevitch, A. Palevski, and Y. Dagan, Physical Review B 80, 140403 (2009).

[6] J. A. Bert, B. Kalisky, C. Bell, M. Kim, Y. Hikita, H. Y. Hwang, and K. A. Moler, Nature physics 7, 767 (2011).

[7] D. Dikin, M. Mehta, C. Bark, C. Folkman, C. Eom, and V. Chandrasekhar, Physical Review Letters 107, 056802 (2011).

[8] Z. Salman, O. Ofer, M. Radovic, H. Hao, M. B. Shalom, K. Chow, Y. Dagan, M. Hossain, C. Levy, W. MacFarlane, et al., Physical review letters 109, 257207 (2012).

[9] J.-S. Lee, Y. Xie, H. Sato, C. Bell, Y. Hikita, H. Hwang, and C.-C. Kao, Nature materials 12, 703 (2013).

[10] A. Ron, E. Maniv, D. Graf, J.-H. Park, and Y. Dagan, Physical review letters 113, 216801 (2014).

[11] M. Ben Shalom, M. Sachs, D. Rakhmilevitch, A. Palevski, and Y. Dagan, Physical review letters 104, 126802 (2010).

[12] A. Caviglia, M. Gabay, S. Gariglio, N. Reyren, C. Cancellieri, and J.-M. Triscone, Physical review letters 104, 126803 (2010).

[13] A. Tsukazaki, A. Ohtomo, T. Kita, Y. Ohno, H. Ohno, and M. Kawasaki, Science 315, 1388 (2007).

[14] A. Ron and Y. Dagan, Physical review letters 112, 136801 (2014).

[15] G. Cheng, M. Tomczyk, S. Lu, J. P. Veazey, M. Huang, P. Irvin, S. Ryu, H. Lee, C.-B. Eom, C. S. Hellberg, et al., Nature 521, 196 (2015).

[16] A. Ohtomo and H. Hwang, Nature 427, 423 (2004).

[17] S. Okamoto and A. J. Millis, Nature 428, 630 (2004).

[18] R. Pentcheva and W. E. Pickett, Physical review letters 102, 107602 (2009).

[19] J. COEY and M. VENKATESAN (2013).

[20] Z. S. Popovi_c, S. Satpathy, and R. M. Martin, Physical review letters 101, 256801 (2008).

[21] S. Pennycook, B. Ra_erty, and P. Nellist, Microscopy and Microanalysis 6, 343 (2000).

[22] L. F. Kourkoutis, H. Xin, T. Higuchi, Y. Hotta, J. Lee, Y. Hikita, D. Schlom, H. Hwang, and D. Muller, Philosophical Magazine 90, 4731 (2010).

[23] Y. Wu, D. Dohler, M. Barr, E. Oks, M. Wolf, L. Santinacci, and J. Bachmann, Nano letters 15, 6379 (2015).

[24] C. Bell, S. Harashima, Y. Kozuka, M. Kim, B. Kim, Y. Hikita, and H. Hwang, Physical review letters 103, 226802 (2009).

[25] Novoselov et al., science 306, 666 (2004).

[26] Kalabukhov et al., Physical Review B 75, 121404 (2007).

[27] Willmott et al., Physical review letters 99, 155502 (2007).

[28] L. Yu and A. Zunger, Nature communications 5 (2014).

What is claimed is:

1. A method of fabricating a heterostructure system, comprising:
epitaxially growing a crystalline layer of a first substance on a crystalline base layer by surface catalysis in a solution, wherein said growth is self-terminated once a monolayer of said first substance is formed on said base layer; and
epitaxially growing an additional crystalline layer of a second substance on said monolayer, thereby forming a heterostructure system comprising said base layer, said monolayer and said additional layer.

2. The method according to claim 1, wherein an interface between said layer of said first substance and said base layer constitutes both electrons and holes.

3. The method according to claim 1, wherein said crystalline base layer is made of an electrically insulating material.

4. The method according to claim 1, wherein said crystalline layer of said first substance forms a half unit cell with a surface of said crystalline base layer on which said crystalline layer of said first substance layer is grown.

5. The method according to claim 1, wherein said crystalline layer of said first substance forms a perovskite crystal structure with a surface of said crystalline base layer on which said crystalline layer of said first substance is grown.

6. The method according to claim 5, wherein said perovskite structure is an oxide.

7. The method according to claim 1, wherein said first substance comprises an element selected from the group consisting of barium, strontium, calcium, magnesium, zinc, titanium, aluminum, zirconium, hafnium, tantalum, vanadium, niobium, manganese, chromium, iron, nickel and cobalt.

8. The method according to claim 1, wherein said additional layer is made of an electrically insulating material.

9. The method according to claim 1, wherein both said base layer and said additional layer are oxides.

10. The method according to claim 9, wherein both said base layer and said additional layer have a perovskite crystal structure.

11. The method according to claim 1, wherein said crystalline base layer comprises $SrTiO_3$, and said additional layer is selected from the group consisting of $LaTiO_3$, $LaAlO_3$, $LaVO_3$, $KTaO_3$, $GdTiO_3$, $LaGaO_3$, $PrAlO_3$, $NdAlO_3$, $NdGaO_3$, $GdAlO_3$, $Al_2O_3$, $DyScO_3$, $CaZrO_3$, $MgO$, $CaO$, $ZnO$, $TiO_2$, $ZrO_2$, $HfO_2$ and $VO_2$.

12. The method according to claim 1, wherein said crystalline base layer is $SrTiO_3$ terminated by $TiO_2$.

13. The method according to claim 1, wherein said additional layer is at least 4 unit cells in thickness.

14. The method according to claim 1, wherein said crystalline base layer is a non-polar crystalline layer, and wherein said crystalline layer of said first substance is a polarity inversion layer.

15. The method according to claim 1, wherein said crystalline layer of said first substance is a polarity inversion layer, wherein said crystalline base layer is a non-polar crystalline layer, and wherein said additional crystalline layer is a polar crystalline layer.

16. The method according to claim 1, wherein said solution is an anhydrous solution.

17. A method of fabricating a heterostructure system, comprising:
epitaxially growing a polarity inversion layer on a non-polar crystalline layer by chemical deposition to form an interface between said non-polar crystalline layer and said polarity inversion layer; and
epitaxially growing a polar crystalline layer on said polarity inversion layer, by a process selected from the group consisting of physical deposition and chemical deposition.

18. The method according to claim 17, wherein said polar crystalline layer exhibits polarity which is inverted relative to a polarity that would have been exhibited by said polar crystalline layer in the absence of said polarity inversion layer.

19. The method according to claim 17, wherein said non-polar crystalline layer is made of an electrically insulating material.

20. The method according to claim 17, wherein said polar crystalline layer is made of an electrically insulating material.

21. The method according to claim 17, wherein a thickness of said interface is from about 1 to about 6 unit cells of said non-polar crystalline layer.

22. The method according to claim 17, wherein said polarity inversion layer is a monolayer.

23. The method according to claim 17, wherein said polarity inversion layer forms a half unit cell with a surface of said non-polar crystalline layer on which said polarity inversion layer is grown.

24. The method according to claim 17, wherein said polarity inversion layer forms a perovskite crystal structure with a surface of said non-polar crystalline layer on which said polarity inversion layer is grown.

* * * * *